United States Patent
Fujimaki

(10) Patent No.: US 11,004,837 B2
(45) Date of Patent: May 11, 2021

(54) SEMICONDUCTOR DEVICE WITH IMPROVED HEAT DISSIPATION

(71) Applicant: Toshiba Memory Corporation, Tokyo (JP)

(72) Inventor: Akiko Fujimaki, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/287,526

(22) Filed: Feb. 27, 2019

(65) Prior Publication Data

US 2020/0091129 A1  Mar. 19, 2020

(30) Foreign Application Priority Data

Sep. 14, 2018  (JP) .............................. JP2018-173003

(51) Int. Cl.
| | |
|---|---|
| *H01L 25/18* | (2006.01) |
| *H01L 23/552* | (2006.01) |
| *H01L 23/498* | (2006.01) |

(52) U.S. Cl.
CPC ............ *H01L 25/18* (2013.01); *H01L 23/552* (2013.01); *H01L 23/49816* (2013.01)

(58) Field of Classification Search
CPC . H01L 25/18; H01L 23/552; H01L 23/49816; H01L 23/367; H01L 23/3128; H01L 23/49822; H01L 23/49838; H01L 25/105; H01L 23/49827; H01L 24/48; H01L 23/3675; H01L 23/5289

USPC ........................................................ 257/659
See application file for complete search history.

(56) References Cited

U.S. PATENT DOCUMENTS

| | | | | |
|---|---|---|---|---|
| 5,198,964 | A * | 3/1993 | Ito ....................... | H01L 23/3107 361/717 |
| 6,127,724 | A * | 10/2000 | DiStefano ............... | H01L 23/16 257/675 |
| 9,219,021 | B2 | 12/2015 | Seko et al. | |
| 9,478,504 | B1 | 10/2016 | Shen et al. | |
| 10,607,914 | B2 * | 3/2020 | Lim .................. | H01L 23/49822 |
| 2004/0195667 | A1 | 10/2004 | Karnezos | |
| 2007/0045829 | A1 | 3/2007 | Jeong et al. | |

(Continued)

FOREIGN PATENT DOCUMENTS

| | | |
|---|---|---|
| JP | H10-256685 A | 9/1998 |
| JP | 2003-037228 A | 2/2003 |

(Continued)

*Primary Examiner* — Alexander O Williams
(74) *Attorney, Agent, or Firm* — Kim & Stewart LLP

(57) ABSTRACT

A semiconductor device includes a substrate, a semiconductor device module, and a heat conductor. The semiconductor device module is on the substrate. The semiconductor device module includes an interposer substrate, one or more semiconductor device chips, a covering resin, and a metal film. The one or more semiconductor device chips are on a first surface of the interposer substrate. The covering resin is in contact with the first surface of the interposer substrate and the one or more semiconductor device chips and encloses the one or more semiconductor device chips. The metal film is in contact with the covering resin and covers the covering resin. The heat conductor is in thermal contact with the substrate and the metal film, and has a higher thermal conductivity than the covering resin.

20 Claims, 8 Drawing Sheets

(56) References Cited

U.S. PATENT DOCUMENTS

| | | | | |
|---|---|---|---|---|
| 2009/0045505 | A1* | 2/2009 | Hsu | H01L 23/3192 257/706 |
| 2010/0244223 | A1* | 9/2010 | Cho | H01L 23/3128 257/690 |
| 2011/0051390 | A1* | 3/2011 | Lin | H01L 27/14618 361/818 |
| 2012/0074585 | A1* | 3/2012 | Koo | H01L 21/486 257/774 |
| 2012/0112361 | A1* | 5/2012 | Han | H01L 23/147 257/774 |
| 2012/0214302 | A1* | 8/2012 | Jeong | H01L 21/76898 438/613 |
| 2012/0217645 | A1* | 8/2012 | Pagaila | H01L 21/486 257/774 |
| 2012/0230001 | A1* | 9/2012 | Takahashi | H01L 23/3128 361/808 |
| 2013/0135823 | A1* | 5/2013 | Kim | H01L 23/043 361/697 |
| 2013/0214396 | A1* | 8/2013 | Kim | H01L 25/105 257/659 |
| 2015/0115467 | A1* | 4/2015 | Park | H01L 23/3128 257/774 |
| 2015/0382448 | A1 | 12/2015 | Pennathur et al. | |
| 2017/0047266 | A1 | 2/2017 | Ihara et al. | |
| 2017/0110382 | A1* | 4/2017 | Kim | H01L 23/29 |
| 2017/0294410 | A1* | 10/2017 | Haba | H01L 24/49 |
| 2018/0138154 | A1 | 5/2018 | Kim et al. | |
| 2019/0101583 | A1* | 4/2019 | Kim | H05K 1/029 |
| 2019/0206839 | A1* | 7/2019 | Balakrishnan | H01L 25/0657 |
| 2019/0273030 | A1* | 9/2019 | Lim | H01L 25/105 |
| 2020/0111720 | A1* | 4/2020 | Wan | H01L 23/13 |

FOREIGN PATENT DOCUMENTS

| | | |
|---|---|---|
| JP | 2012-182395 A | 9/2012 |
| JP | 5945326 B2 | 7/2016 |
| WO | 2014020783 A1 | 2/2014 |

* cited by examiner

SEMICONDUCTOR DEVICE WITH IMPROVED HEAT DISSIPATION

CROSS-REFERENCE TO RELATED APPLICATION

This application is based upon and claims the benefit of priority from Japanese Patent Application No. 2018-173003, filed on Sep. 14, 2018, the entire contents of which are incorporated herein by reference.

FIELD

Embodiments described herein relate generally to a semiconductor device.

BACKGROUND

A semiconductor component having an electronic component mounted on an interposer substrate and a sealing resin sealing the electronic component is known. The semiconductor component is mounted on a substrate via a terminal. Heat dissipation from the semiconductor component occurs by heat being transferred to the substrate via the terminal. However, the heat dissipation from the semiconductor component may not be sufficient, and therefore it is desirable to achieve further heat dissipation from the semiconductor component.

DETAILED DESCRIPTION

In general, according to an embodiment, a semiconductor device includes a substrate, a semiconductor device module, and a heat conductor. The semiconductor device module is on the substrate. The semiconductor device module includes an interposer substrate, one or more semiconductor device chips, a covering resin, and a metal film. The one or more semiconductor device chips are on a first surface of the interposer substrate. The covering resin is in contact with the first surface of the interposer substrate and the one or more semiconductor device chips and encloses the one or more semiconductor device chips. The metal film is in contact with the covering resin and covers the covering resin. The heat conductor is in thermal contact with the substrate and the metal film, and has a higher thermal conductivity than the covering resin.

First Embodiment

Hereinafter, a first embodiment is described with reference to FIG. 1 to FIG. 3. Furthermore, in the present specification, an element in an embodiment and the explanation of the element may be described with a plurality of expressions. Each element and the description thereof are not limited by expressions in the present specification. Each element may be specified by a name different from that used in the present specification. Moreover, each element may be described with an expression different from the expression used in the present specification.

Figure 1:
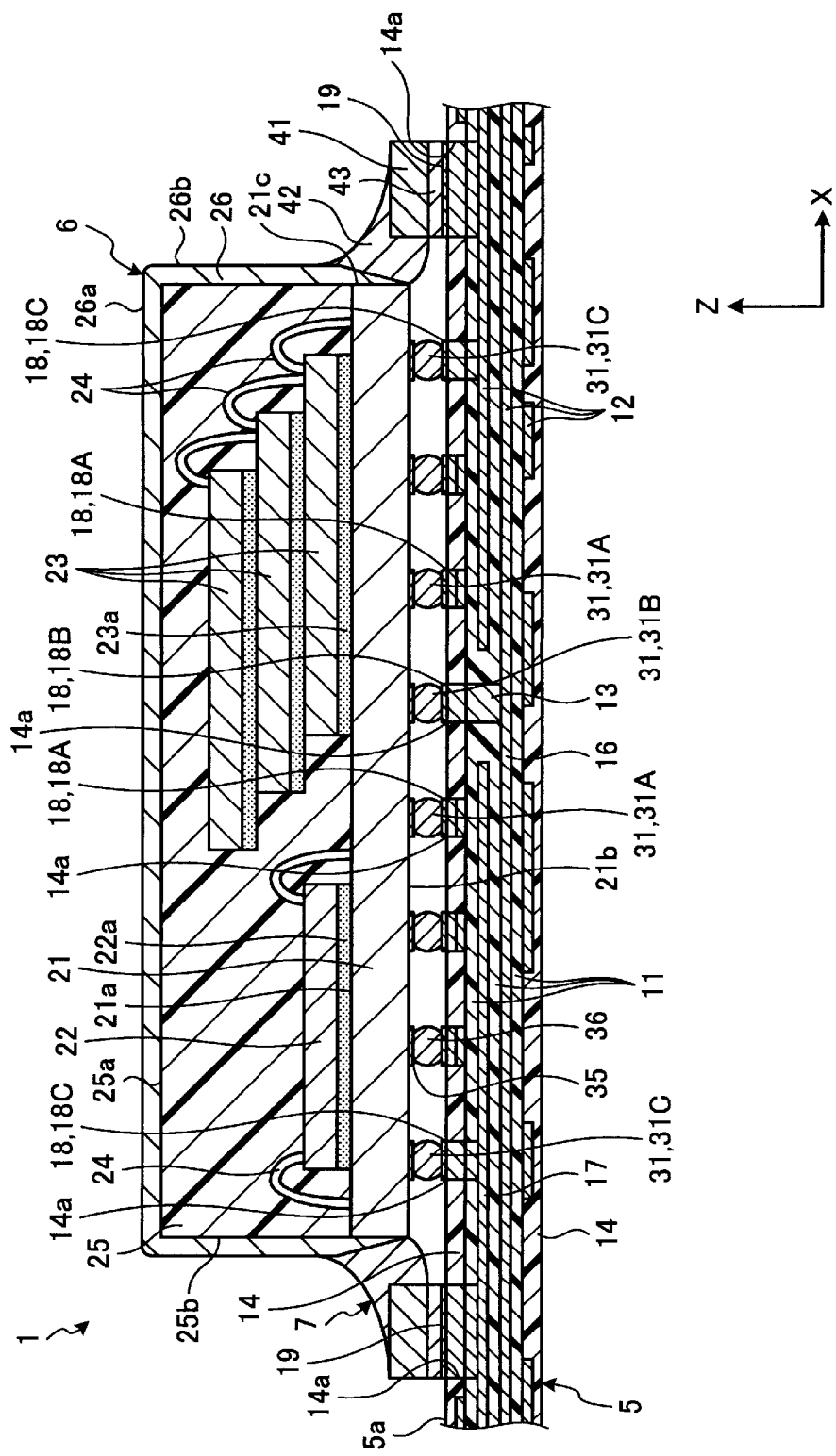
FIG. 1 illustrates a cross-sectional view of a part of a semiconductor device according to a first embodiment.

FIG. 1 illustrates a cross-sectional view of a part of a semiconductor device 1 according to the first embodiment. The semiconductor device 1 may also be referred to as an "electronic apparatus" or a "semiconductor storage device". The semiconductor device 1 serving as an example in the present embodiment is a smartphone. The semiconductor device 1 may be, for example, a personal computer, a portable computer, a tablet, a mobile phone, a television receiver, a hard disk drive (HDD), a solid-state drive (SSD), a USB flash drive, an SD card, eMMC®, a universal flash storage (UFS), a memory card, another type of storage device, a wearable device, a smart speaker, household electrical equipment, or another type of device having a semiconductor. As illustrated in FIG. 1, the semiconductor device 1 includes a substrate 5, a semiconductor component (e.g., semiconductor device module) 6, and a heat conductor 7.

The substrate 5 is, for example, a printed circuit board (PCB). The substrate 5 includes an obverse surface (e.g., front surface) 5a. The obverse surface 5a is an approximately flat surface facing in a positive direction of the Z-axis (a direction indicated by the Z-axis arrow). The semiconductor component 6 is mounted on the obverse surface 5a of the substrate 5. Additionally, another type of device such as a central processing unit (CPU), which controls the semiconductor device 1, may be mounted on the substrate 5.

The substrate 5 further includes a plurality of base materials 11, a plurality of conductor layers 12, a plurality of vias 13, and two solder resists 14. Thus, the substrate 5 is a multi-layer board having a plurality of layers, but may be a single-faced board.

The base material 11 is an insulating layer provided inside the substrate 5. The conductor layer 12 is provided on the obverse surface of the base material 11, and is used to form, for example, wiring lines, lands, pads, and solid patterns (planes) in the substrate 5. The via 13 is provided in the base material 11 and interconnects a plurality of conductor layers 12. The solder resists 14 cover the base materials 11 and the conductor layers 12. One of the solder resists 14 forms at least a part of the obverse surface 5a of the substrate 5, and is located between the base material 11 and the semiconductor component 6.

The conductor layer 12 includes a power source 16, a ground 17, a plurality of electrodes 18, and a plurality of ground pads 19. The ground pad 19 is an example of a conductor, and may also be referred to as a "land" or a "pattern".

The power source 16 includes, for example, a power source layer for the solid pattern and wiring lines connected to the power source layer. The ground 17 is a conductor having ground potential. The ground 17 includes, for example, a ground layer for the solid pattern and wiring lines connected to the ground layer.

The electrode 18 is provided in the conductor layer 12 covered with the solder resist 14 forming the obverse surface 5a. The electrode 18 includes a signal electrode 18A, a power source electrode 18B, and a ground electrode 18C. The signal electrode 18A is used to transmit and receive signals between a circuit provided in the substrate 5 and the semiconductor component 6. Therefore, an electrical signal passes through the signal electrode 18A. The power source electrode 18B is connected to the power source 16. The ground electrode 18C is connected to the ground 17.

The electrodes 18 are arranged, for example, in a matrix shape (lattice-like shape). The ground electrode 18C is located closer to the outer side than the signal electrode 18A and the power source electrode 18B. Furthermore, the ground electrode 18C connected to the ground 17 may be located closer to the inner side than the signal electrode 18A and the power source electrode 18B.

The ground pad 19 is provided in the conductor layer 12 covered with the solder resist 14 forming the obverse surface 5a. The ground pad 19 is connected to the ground 17.

Figure 2:
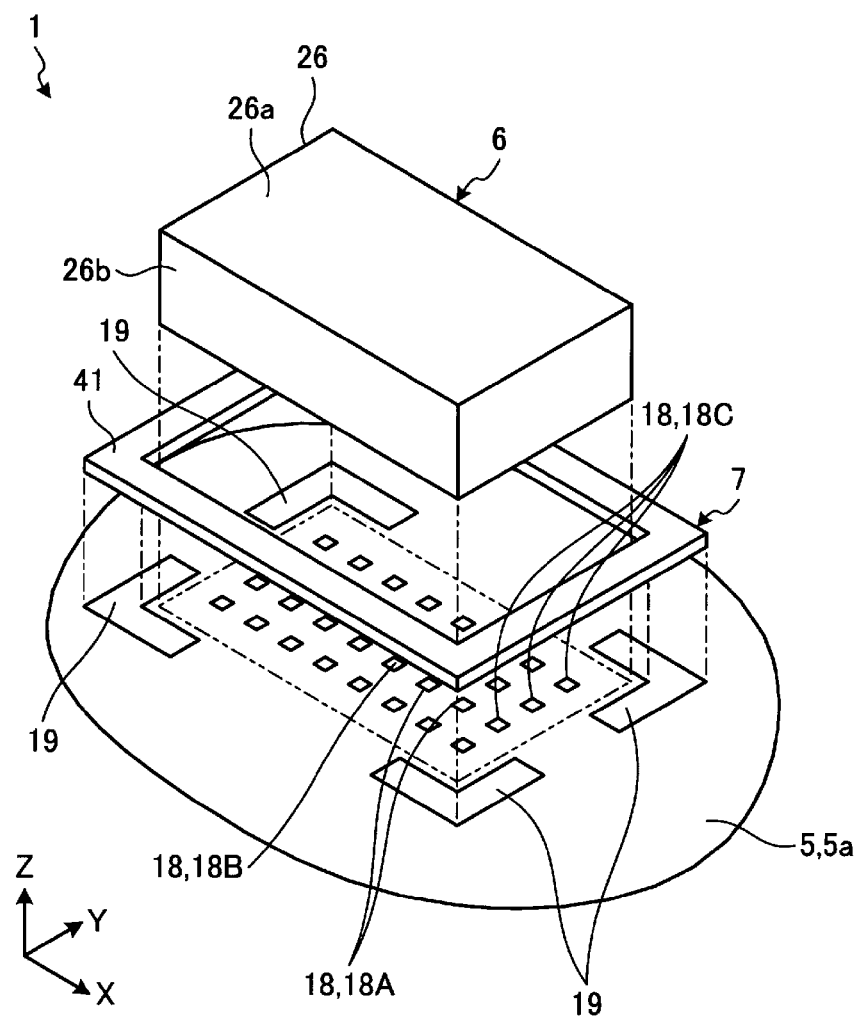
FIG. 2 illustrates a perspective view of the semiconductor device according to the first embodiment in an exploded manner.

FIG. 2 illustrates a perspective view of the semiconductor device 1 according to the first embodiment in an exploded manner. As illustrated in FIG. 2, the ground pad 19 extends along the electrodes 18 and surrounds the electrodes 18. A plurality of ground pads 19 is away from each other. Therefore, the conductor layer 12 may include wiring lines passing through a space between two ground pads 19.

As illustrated in FIG. 1, a plurality of holes 14a is provided in the solder resist 14. The hole 14a causes the electrode 18 and the ground pad 19 to be exposed. With this, the electrode 18 and the ground pad 19 are provided on the obverse surface 5a of the substrate 5.

The semiconductor component 6 serving as an example in the present embodiment is a semiconductor package of the ball grid array (BGA). Furthermore, the semiconductor component 6 may have another structure, or may be a semiconductor package of another standard, such as a land grid array (LGA).

As indicated in the drawings, in the present specification, the X-axis, Y-axis, and Z-axis are defined. The X-axis, Y-axis, and Z-axis are perpendicular to each other. The X-axis extends along the width of the semiconductor component 6. The Y-axis extends along the length (depth) of the semiconductor component 6. The z-axis extends along the height (thickness) of the semiconductor component 6.

The semiconductor component 6 includes an interposer substrate 21, a controller chip 22, a plurality of memory chips 23, a plurality of bonding wires 24, a sealing resin 25, and a metal film 26. Each of the controller chip 22 and the memory chip 23 is an example of an electronic component. The sealing resin 25 is an example of a covering resin.

The interposer substrate 21 is, for example, a printed wiring board (PWB). The interposer substrate 21 includes a first surface 21a, a second surface 21b, and an end surface 21c. The first surface 21a is an approximately flat surface facing in the positive direction of the Z-axis. The second surface 21b is located on an opposite side of the first surface 21a and is an approximately flat surface facing in the negative direction of the Z-axis (a direction opposite to that indicated by the arrow of the Z-axis). The second surface 21b and the obverse surface 5a of the substrate 5 face each other. The end surface 21c is provided between the edge of the first surface 21a and the edge of the second surface 21b and faces in a direction intersecting with the Z-axis.

The interposer substrate 21 further includes a plurality of terminals 31. Each of the terminals 31 includes a pad 35 and a solder ball 36. The solder ball 36 may also be referred to as a "bump". The solder ball 36 is connected to a corresponding electrode 18. Furthermore, the terminal 31 may be different from the pad 35 and the solder ball 36, for example, depending on the standard of a semiconductor component 6. For example, in a case where the semiconductor component 6 is of the LGA standard, the terminal 31 includes the pad 35 but does not include the solder ball 36.

The terminal 31 is provided on the second surface 21b. The terminal 31 includes a signal terminal 31A, a power source terminal 31B, and a ground terminal 31C. The signal terminal 31A is connected to the signal electrode 18A. The power source terminal 31B is connected to the power source electrode 18B. The ground terminal 31C is connected to the ground electrode 18C.

The terminals 31 are arranged, for example, in a matrix shape (lattice-like shape). The ground terminal 31C is located closer to the outer side than the signal terminal 31A and the power source terminal 31B. Furthermore, the ground terminal 31C connected to the ground 17 via the electrode 18 may be located closer to the inner side than the signal terminal 31A and the power source terminal 31B.

The controller chip 22 is, for example, a system on a chip (SoC). Furthermore, the controller chip 22 may be another integrated circuit (IC) or another type of circuit.

The controller chip 22 is mounted on the first surface 21a of the interposer substrate 21. For example, the controller chip 22 is bonded to the first surface 21a via an adhesion layer 22a. Additionally, the electrode of the controller chip 22 and the electrode provided on the first surface 21a are interconnected by the bonding wire 24. With this, the controller chip 22 is electrically connected to the terminals 31 via wiring lines provided in the interposer substrate 21. Furthermore, the controller chip 22 may be mounted on the first surface 21a, for example, by flip chip mounting.

The memory chip 23 is, for example, a NAND-type flash memory, and stores information. Furthermore, the memory chip 23 may be another type of memory chip such as a NOR-type flash memory.

The memory chips 23 are mounted and stacked on the first surface 21a of the interposer substrate 21. For example, the memory chip 23 is bonded to the first surface 21a via an adhesion layer 23a. Additionally, the electrode of the memory chip 23 and an electrode provided on the first surface 21a are interconnected by a bonding wire 24. With this, the memory chip 23 is electrically connected to the controller chip 22 via wiring lines provided in the interposer substrate 21. Furthermore, the memory chip 23 may be mounted on the first surface 21a, for example, by flip chip mounting.

Each of the adhesion layers 22a and 23a is a die attach film (DAF). The die attach film may also be referred to as a "die bonding film". Each of the adhesion layers 22a and 23a may be, for example, adhesive.

For example, the controller chip 22 controls storing and readout of the memory chip 23. Furthermore, the controller chip 22 may control not only the memory chip 23 but also another electronic component in the semiconductor component 6.

In the present embodiment, both the controller chip 22 and the memory chip 23 are mounted on the first surface 21a. However, for example, the memory chip 23 may be stacked on the controller chip 22.

The sealing resin 25 is made from, for example, a synthetic resin including an epoxy resin in which an inorganic substance such as silicon dioxide is mixed. Furthermore, the sealing resin 25 may be made from a material including another synthetic resin.

The sealing resin 25 seals the first surface 21a of the interposer substrate 21, the controller chip 22, the memory chips 23, and the bonding wires 24. Accordingly, the sealing resin 25 is in contact with the first surface 21a, the controller chip 22, the memory chips 23, and the bonding wires 24 to cover the first surface 21a, the controller chip 22, the memory chips 23, and the bonding wires 24.

The controller chip 22, the memory chips 23, and the bonding wires 24 are embedded in the sealing resin 25. In other words, the controller chip 22, the memory chips 23, and the bonding wires 24 are contained in the sealing resin 25 and are present inside the sealing resin 25.

The sealing resin 25 includes an upper surface 25a and a side surface 25b. The upper surface 25a is an external surface of the sealing resin 25 which faces in the positive direction of the Z-axis and is approximately flat. The side surface 25b is an external surface of the sealing resin 25 which extends from the edge of the upper surface 25a in the negative direction of the Z-axis, and faces in a direction intersecting with the Z-axis. The side surface 25b is substantially continuous to the end surface 21c of the interposer substrate 21.

The metal film 26 is in contact with the upper surface 25a and the side surface 25b of the sealing resin 25 to cover the sealing resin 25. In the present embodiment, the metal film 26 also covers the end surface 21c of the interposer substrate 21. The metal film 26 is caused to adhere to the sealing resin 25, for example, by sputtering. The metal film 26 may be formed by another method such as application of a paste.

The metal film 26 includes an upper surface 26a and a side surface 26b. The upper surface 26a is an external surface of the metal film 26 which faces in the positive direction of the Z-axis and is approximately flat. The side surface 26b is an external surface of the metal film 26 which extends from the edge of the upper surface 26a in the negative direction of the Z-axis, and faces in a direction almost intersecting with the Z-axis.

The metal film 26 covers the controller chip 22 and the memory chips 23 via the sealing resin 25. The metal film 26 is an electromagnetic shield which shields electromagnetic waves radiated by the controller chip 22 and the memory chips 23 and external electromagnetic waves.

The heat conductor 7 interconnects the substrate 5 and the metal film 26 of the semiconductor component 6. The heat conductor 7 has conductive property as a whole and is higher in thermal conductivity than the sealing resin 25.

Furthermore, the heat conductor 7 only needs to be higher in thermal conductivity than the sealing resin 25 in a thermal pathway between the substrate 5 and the metal film 26. Accordingly, the heat conductor 7 may contain a portion which is lower in thermal conductivity than the sealing resin 25. Moreover, the heat conductor 7 may contain an insulating portion. The heat conductor 7 includes a metal member 41, a first paste 42, and a second paste 43.

As illustrated in FIG. 2, the metal member 41 is formed in the shape of an approximately quadrangular collar corresponding to the ground pads 19 of the substrate 5. Furthermore, the shape of the metal member 41 is not limited to this, but may be, for example, a rod-like shape. The metal member 41 is higher in thermal conductivity than the sealing resin 25.

Figure 3:
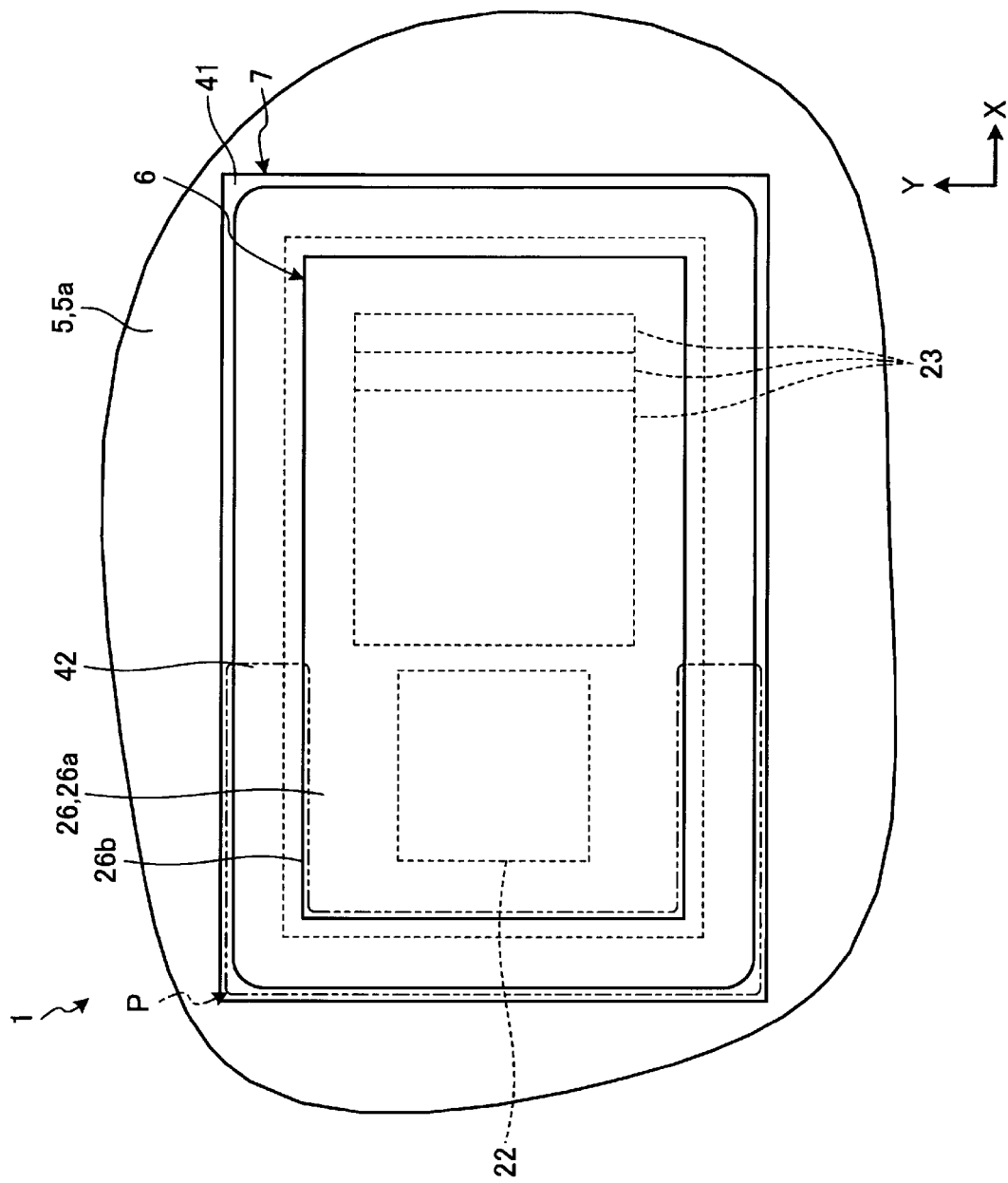
FIG. 3 illustrates a plan view of a part of the semiconductor device according to the first embodiment.

FIG. 3 illustrates a plan view of a part of the semiconductor device 1 according to the first embodiment. In FIG. 3, for illustrative purpose, the first paste 42 and the second paste 43 are omitted from illustration. As illustrated in FIG. 3, in a plan view facing the obverse surface 5a of the substrate 5, the metal member 41 surrounds the semiconductor component 6 across a clearance. In other words, the metal member 41 is away from the semiconductor component 6 in a direction intersecting with the Z-axis. Furthermore, the semiconductor component 6 may partially overlap the metal member 41 in a direction intersecting with the Z-axis.

As illustrated in FIG. 1, the metal member 41 covers the ground pads 19. The metal member 41 is bonded to the ground pads 19 provided on the obverse surface 5a with the second paste 43. Furthermore, the metal member 41 may be additionally bonded to another portion of the obverse surface 5a formed from the solder resist 14. Moreover, the metal member 41 may be bonded to the ground pads 19 via another means such as soldering.

The second paste 43 is so-called a thermally conductive paste. The second paste 43 contains, for example, a thermosetting synthetic resin and a silver filler. Therefore, the second paste 43 has not only conductive property but also a higher thermal conductivity than that of the sealing resin 25. For example, the thermal conductivity of the second paste 43 is greater than or equal to 50 W/mK, but is not limited to this value. Furthermore, the second paste 43 may contain silicon instead of the silver filler and may have insulation properties. The above-described material of the second paste 43 is an example and is not limited to this example.

The second paste 43 is hardened in the state of adhering to the metal member 41 and the ground pads 19. Therefore, the second paste 43 fixes the metal member 41 to the ground pads 19. Furthermore, the second paste 43 may have fluidity without being hardened. The metal member 41 is thermally and electrically connected to the ground pads 19 by the second paste 43.

The first paste 42 is so-called a thermally conductive paste as with the second paste 43. The first paste 42 contains, for example, a thermosetting synthetic resin and a silver filler. Therefore, the first paste 42 has not only conductive property but also a higher thermal conductivity than that of the sealing resin 25. For example, the thermal conductivity of the first paste 42 is greater than or equal to 50 W/mK, but is not limited to this value. Furthermore, the first paste 42 may contain silicon instead of the silver filler and may have insulation properties. The above-described material of the first paste 42 is an example and is not limited to this example.

The first paste 42 is hardened in the state of adhering to the side surface 26b of the metal film 26 and the metal member 41. Therefore, the first paste 42 thermally and electrically connects the metal film 26 to the metal member 41. Furthermore, the first paste 42 may have fluidity without being hardened.

The first paste 42 thermally and electrically interconnects the metal film 26 and the ground pads 19 of the substrate 5 via the metal member 41 and the second paste 43. Therefore, heat generated from the controller chip 22 and the memory chips 23 is transferred to the ground pads 19 via the sealing resin 25, the metal film 26, the first paste 42, the metal member 41, and the second paste 43. The heat transferred to the ground pads 19 is released to, for example, an apparatus, such as a server or a personal computer, in which the semiconductor device 1 is mounted.

As illustrated in FIG. 3, the first paste 42 has a portion P closer to the controller chip 22 than to the memory chips 23. The controller chip 22 is more likely to become at high temperature than the memory chips 23. Heat generated from the controller chip 22 may be released through the first paste 42, which is close to the controller chip 22.

As illustrated in FIG. 1, the metal film 26 is electrically connected to the ground 17 via the first paste 42, the metal member 41, the second paste 43, and the ground pads 19. The metal film 26 is able to release absorbed electromagnetic noise to the ground 17.

Next, a part of the method for mounting the semiconductor component 6 and the heat conductor 7 is described as an example. Furthermore, the method for mounting the semiconductor component 6 and the heat conductor 7 is not limited to the following method, but may be another method. First, the terminals 31 of the semiconductor component 6 are connected to the electrodes 18 of the substrate 5. For example, the solder balls 36 of the terminals 31 are connected to the electrodes 18 by reflow soldering.

Next, the second paste 43 is applied to the ground pads 19 by a dispenser. Moreover, the metal member 41 is placed on the second paste 43, and is then bonded to the ground pads 19 with the second paste 43.

Next, the first paste 42 is suppled to a space between the metal member 41 and the metal film 26 by a dispenser. The first paste 42 adheres to the metal member 41 and the metal film 26. Then, the second paste 43 and the first paste 42 are thermally hardened, so that mounting of the semiconductor component 6 and the heat conductor 7 is completed.

Adjusting the degree of viscosity of the first paste 42 prevents or reduces the first paste 42 from entering a clearance between the substrate 5 and the interposer substrate 21. However, there is a possibility of the first paste 42 entering a clearance between the substrate 5 and the interposer substrate 21.

As described above, the ground terminal 31C is located on the side closer to the outside than the signal terminal 31A and the power source terminal 31B. Therefore, the ground terminal 31C is closer to the heat conductor 7 than the signal terminal 31A and the power source terminal 31B.

The first paste 42 having entered a clearance between the substrate 5 and the interposer substrate 21 is likely to adhere to the ground terminal 31C than to the signal terminal 31A and the power source terminal 31B. In this case, the metal film 26 and the metal member 41 are electrically connected to the ground terminal 31C and the ground 17 via the first paste 42. However, even in a usual condition, the metal film 26 and the metal member 41 are electrically connected to the ground 17 via the ground pads 19. Therefore, the occurrence of a short circuit at the ground terminal 31C can be prevented or reduced.

A plurality of ground terminals 31C is arranged side by side along the end surface 21c of the interposer substrate 21. Therefore, the ground terminals 31C blocks the first paste 42 and prevents or reduces the first paste 42 from adhering to the signal terminal 31A and the power source terminal 31B. While the above description relates to the first paste 42, which is used as a typical example, the same also applies to the second paste 43.

In the semiconductor device 1 according to the above-described first embodiment, the heat conductor 7 adheres to the metal film 26 of the semiconductor component 6, interconnects the substrate 5 and the metal film 26, and is higher in thermal conductivity than the sealing resin 25. This enables heat generated by the controller chip 22 and the memory chips 23 to be transferred to the substrate 5 via the sealing resin 25, the metal film 26, and the heat conductor 7. Accordingly, further heat dissipation of the controller chip 22 and the memory chips 23 can be achieved.

The substrate 5 includes the ground pads 19 provided on the obverse surface 5a. The heat conductor 7 interconnects the metal film 26 and the ground pads 19. This enables heat generated by the controller chip 22 and the memory chips 23 to be efficiently transferred to the substrate 5 via the heat conductor 7 as compared with a case where the heat conductor 7 interconnects another portion of the substrate 5 such as the solder resist 14 and the metal film 26. Accordingly, efficient heat dissipation of the controller chip 22 and the memory chips 23 can be achieved.

The heat conductor 7 is electrically conductive, and the ground pads 19 are connected to the ground 17. This causes the metal film 26 of the semiconductor component 6 to be electrically connected to the ground 17 via the heat conductor 7. Accordingly, the performance of the metal film 26 as an electromagnetic shield can be increased.

The ground terminal 31C is not only connected to the ground 17 via the ground electrode 18C but also closer to the heat conductor 7 than the signal terminal 31A and the power source terminal 31B. Therefore, even if the first paste 42 of the heat conductor 7 enters a space between the second surface 21b of the interposer substrate 21 and the obverse surface 5a of the substrate 5, the first paste 42 is more likely to adhere to the ground terminal 31C than to the signal terminal 31A or the power source terminal 31B. Accordingly, a short circuit caused by the first paste 42 adhering to the signal terminal 31A or the power source terminal 31B can be prevented or reduced.

The heat conductor 7 includes the first paste 42 adhering to the metal film 26. This enables easily providing the heat conductor 7 with use of, for example, a device such as a dispenser.

The heat conductor 7 includes the metal member 41, which is thermally and electrically connected to the ground pads 19. The first paste 42 adheres to the metal member 41. In other words, the metal film 26 of the semiconductor component 6 is connected to the ground pads 19 of the substrate 5 via the first paste 42 and the metal member 41. The metal member 41 is usually smaller in thermal resistance than a synthetic resin and has a large surface area, and is, therefore, able to efficiently transfer heat generated by the controller chip 22 and the memory chips 23 to the substrate 5. Accordingly, efficient heat dissipation of the controller chip 22 and the memory chips 23 can be achieved.

In a plan view facing the obverse surface 5a, the metal member 41 surrounds the semiconductor component 6. This increase the surface area of the metal member 41, thus enabling heat generated by the controller chip 22 and the memory chips to be efficiently transferred to the substrate 5.

Accordingly, efficient heat dissipation of the controller chip 22 and the memory chips 23 can be achieved.

The first paste 42 contains a thermosetting resin. This prevents or reduces the first paste 42 when hardened from being detached from the metal film 26. Additionally, this enables performing hardening of the first paste 42 at the same time as hardening of an underfill which is applied to other electronic components. Accordingly, any increase in working process is prevented or reduced and any increase in cost of the semiconductor device 1 is prevented or reduced.

The heat conductor 7 contains a thermosetting resin, adheres to the metal member 41 and the ground pads 19, is higher in thermal conductivity than the sealing resin 25, and includes the second paste 43 having conductive property. The first paste 42 and the second paste 43 are hardened. This causes the metal member 41 and the ground pads 19 to be electrically interconnected by the second paste 43. Additionally, this enables hardening of the first paste 42 and the second paste 43 to be simultaneously performed, so that any increase in working process is prevented or reduced and any increase in cost of the semiconductor device 1 is prevented or reduced. Moreover, the first paste 42 and the second paste 43 tightly fix the semiconductor component 6 to the substrate 5 as with an underfill. This prevents or reduces a connecting portion between the terminal 31 and the electrode 18 from being damaged.

The heat conductor 7 has a portion P closer to the controller chip 22 than to the memory chips 23. Usually, the controller chip 22 is more likely to become at high temperature than the memory chip 23. Accordingly, heat of the controller chip 22 is able to be transferred to the substrate 5 via the sealing resin 25, the metal film 26, and the heat conductor 7. Accordingly, efficient heat dissipation of the controller chip 22 and the memory chips 23 can be achieved.

In the above-described first embodiment, the first paste 42 and the second paste 43 interconnect the metal film 26 and the ground pads 19 via the metal member 41. However, the first paste 42 and the second paste 43 may directly interconnect the metal film 26 and the ground pads 19. This prevents or reduces any increase in working process and also prevents or reduces any increase in cost of the semiconductor device 1.

Moreover, in the above-described first embodiment, the ground pads 19 to which the heat conductor 7 is connected are connected to the ground 17. However, a conductor (e.g., a ground pad 19) to which the heat conductor 7 is connected may be a non-connect pad, which is separated from the conductor layers 12 forming circuits in the substrate 5. Moreover, if the heat conductor 7 is insulative, the above-described conductor may be electrically connected to, for example, the signal electrode 18A or the power source electrode 18B.

Second Embodiment

A second embodiment is described as follows with reference to FIG. 4. Furthermore, in the description of the following plurality of embodiments, elements having functions similar to those of previously-described elements are assigned the respective same reference characters as those of the previously-described elements, and may be omitted from description in some cases. Moreover, a plurality of elements assigned with the same reference characters does not necessarily have all the functions and properties in common, but may have different functions and properties corresponding to the respective embodiments.

Figure 4:
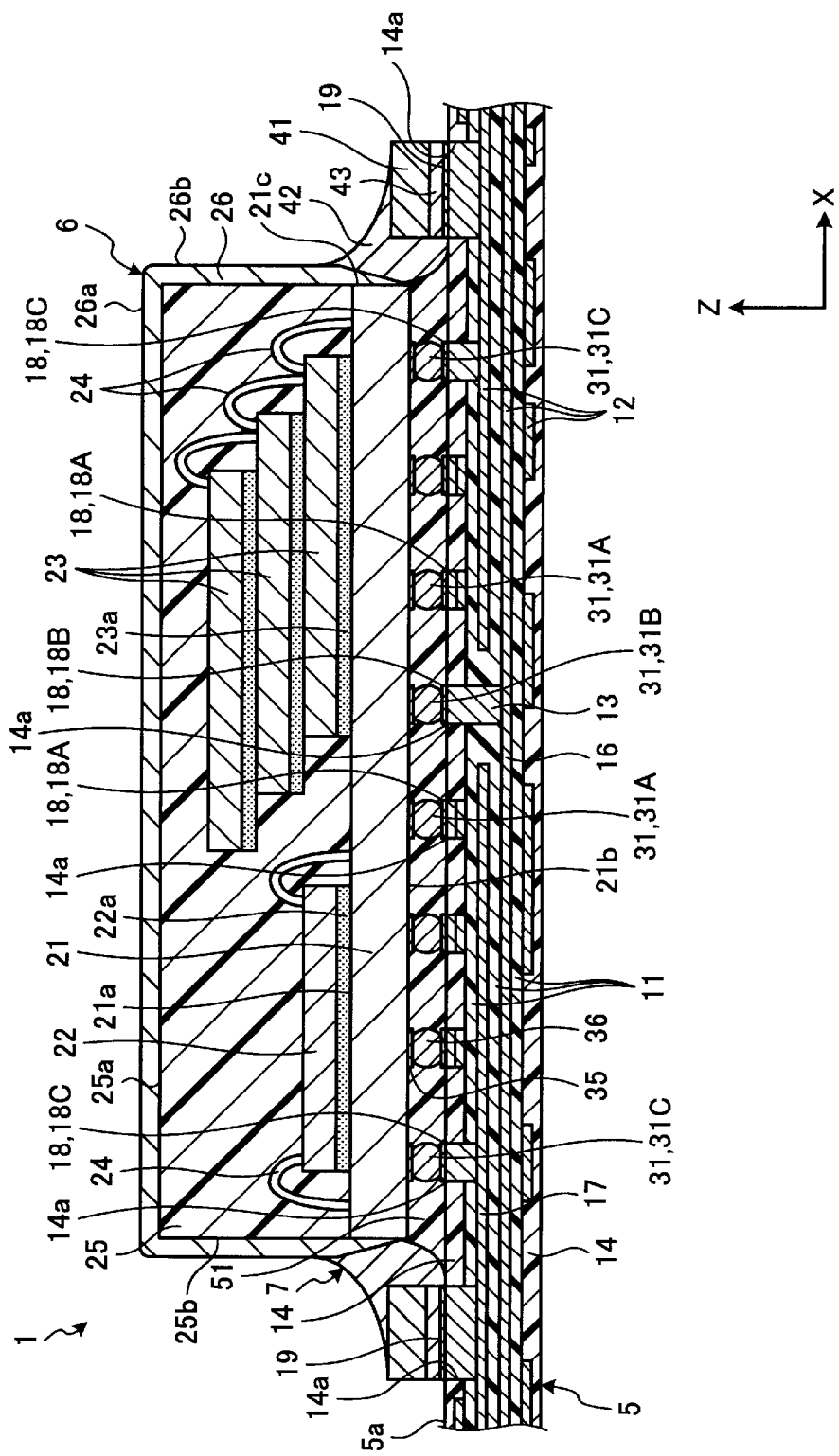
FIG. 4 illustrates a cross-sectional view of a part of a semiconductor device according to a second embodiment.

FIG. 4 illustrates a cross-sectional view of a part of a semiconductor device 1 according to the second embodiment. As illustrated in FIG. 4, the semiconductor device 1 according to the second embodiment includes an underfill 51 of insulation. The underfill 51 lies between the obverse surface 5a of the substrate 5 and the second surface 21b of the interposer substrate 21.

The underfill 51 infills a clearance between the obverse surface 5a of the substrate 5 and the second surface 21b of the interposer substrate 21. Therefore, the underfill 51 is located between the terminal 31 and the heat conductor 7. In the present embodiment, the underfill 51 is in contact with the terminal 31 to cover the terminal 31. Furthermore, the underfill 51 may be away from the terminal 31.

For example, after the terminal 31 is connected to the electrode 18, the underfill 51 is supplied to a space between the substrate 5 and the interposer substrate 21 by a dispenser. The underfill 51 is thermally hardened together with, for example, the first paste 42 and the second paste 43.

In the semiconductor device 1 according to the above-described second embodiment, the underfill 51 of insulation lies between the obverse surface 5a of the substrate 5 and the second surface 21b of the interposer substrate 21 and is located between the terminal 31 and the heat conductor 7. This prevents or reduces a short circuit from occurring due to the conductive first paste 42 adhering to the terminal 31. Additionally, since the semiconductor component 6 is tightly fixed to the substrate 5 by the underfill 51, a connecting portion between the terminal 31 and the electrode 18 is prevented or reduced from being damaged.

Third Embodiment

Figure 5:
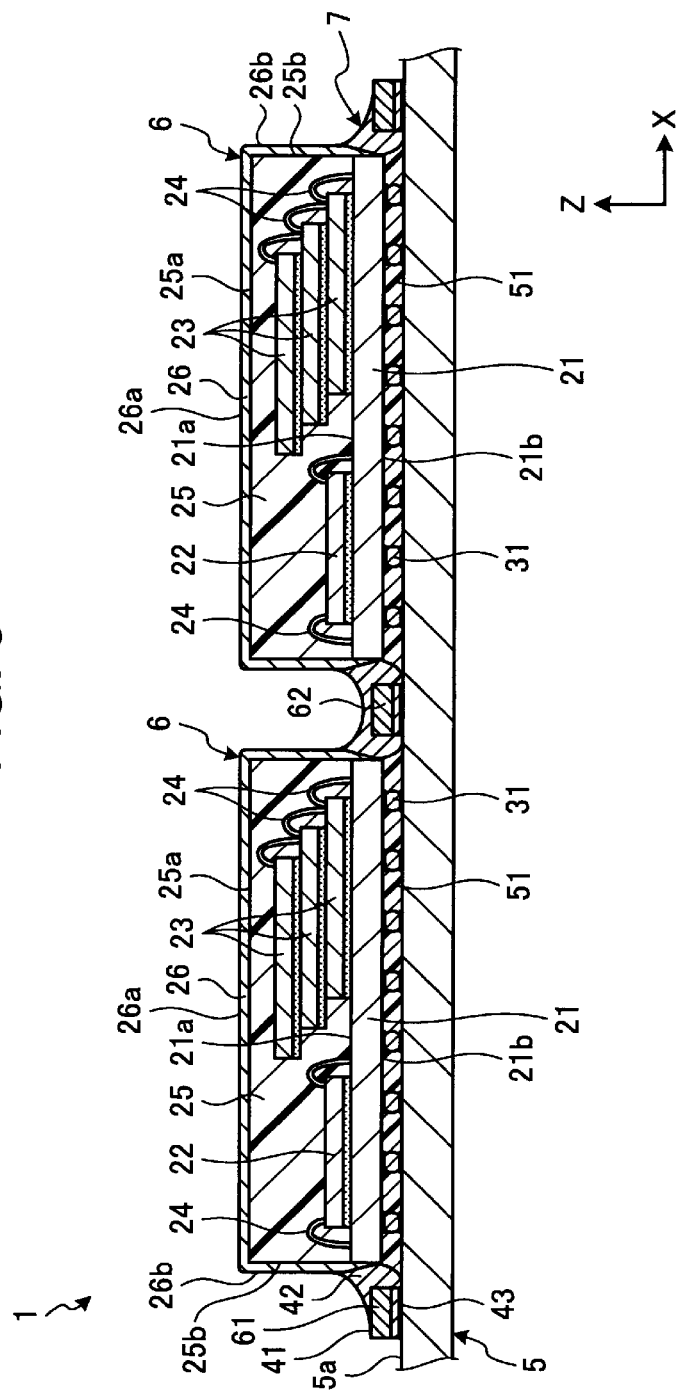
FIG. 5 illustrates a cross-sectional view of a part of a semiconductor device according to a third embodiment.

A third embodiment is described as follows with reference to FIG. 5 to FIG. 7. FIG. 5 illustrates a cross-sectional view of a part of a semiconductor device 1 according to the third embodiment. As illustrated in FIG. 5, the semiconductor device 1 of the third embodiment differs from that of the second embodiment in including a plurality of semiconductor components 6 mounted on the obverse surface 5a of the substrate 5. The semiconductor components 6 may be components identical to each other or may be components different from each other. Moreover, the semiconductor device 1 of the third embodiment may include no underfill 51, as with the first embodiment.

Figure 6:
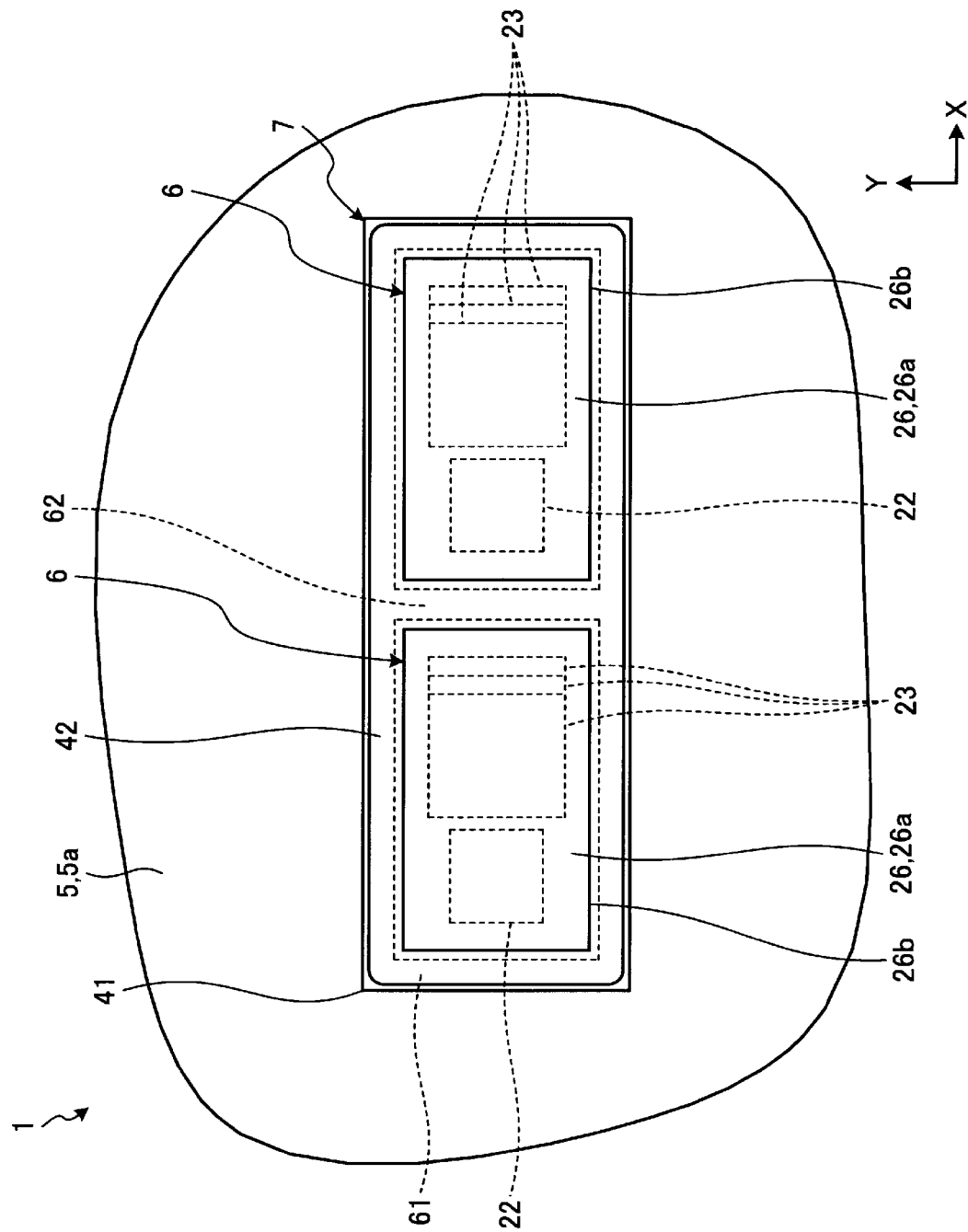
FIG. 6 illustrates a plan view of a part of the semiconductor device according to the third embodiment.

FIG. 6 illustrates a plan view of a part of the semiconductor device 1 according to the third embodiment. As illustrated in FIG. 6, the metal member 41 includes a frame portion 61 and an intermediate portion 62. The frame portion 61 is formed in the shape of an approximately quadrangular collar, and, in a plan view facing the obverse surface 5a of the substrate 5, surrounds a plurality of semiconductor components 6. The intermediate portion 62 is located between two adjacent semiconductor components 6 and is connected to the frame portion 61.

The first paste 42 adheres to the metal film 26, the frame portion 61, and the intermediate portion 62. Therefore, the first paste 42 thermally and electrically interconnects the metal film 26 of one semiconductor component 6, the metal film 26 of the other semiconductor component 6, and the ground pads 19.

In the semiconductor device 1 according to the above-described third embodiment, in a plan view facing the obverse surface 5a, the metal member 41 surrounds a plurality of semiconductor components 6. This increase the surface area of the metal member 41, thus enabling heat generated by the controller chip 22 and the memory chips 23 to be efficiently transferred to the substrate 5. Accordingly, efficient heat dissipation of the controller chip 22 and the memory chips 23 can be achieved.

Figure 7:
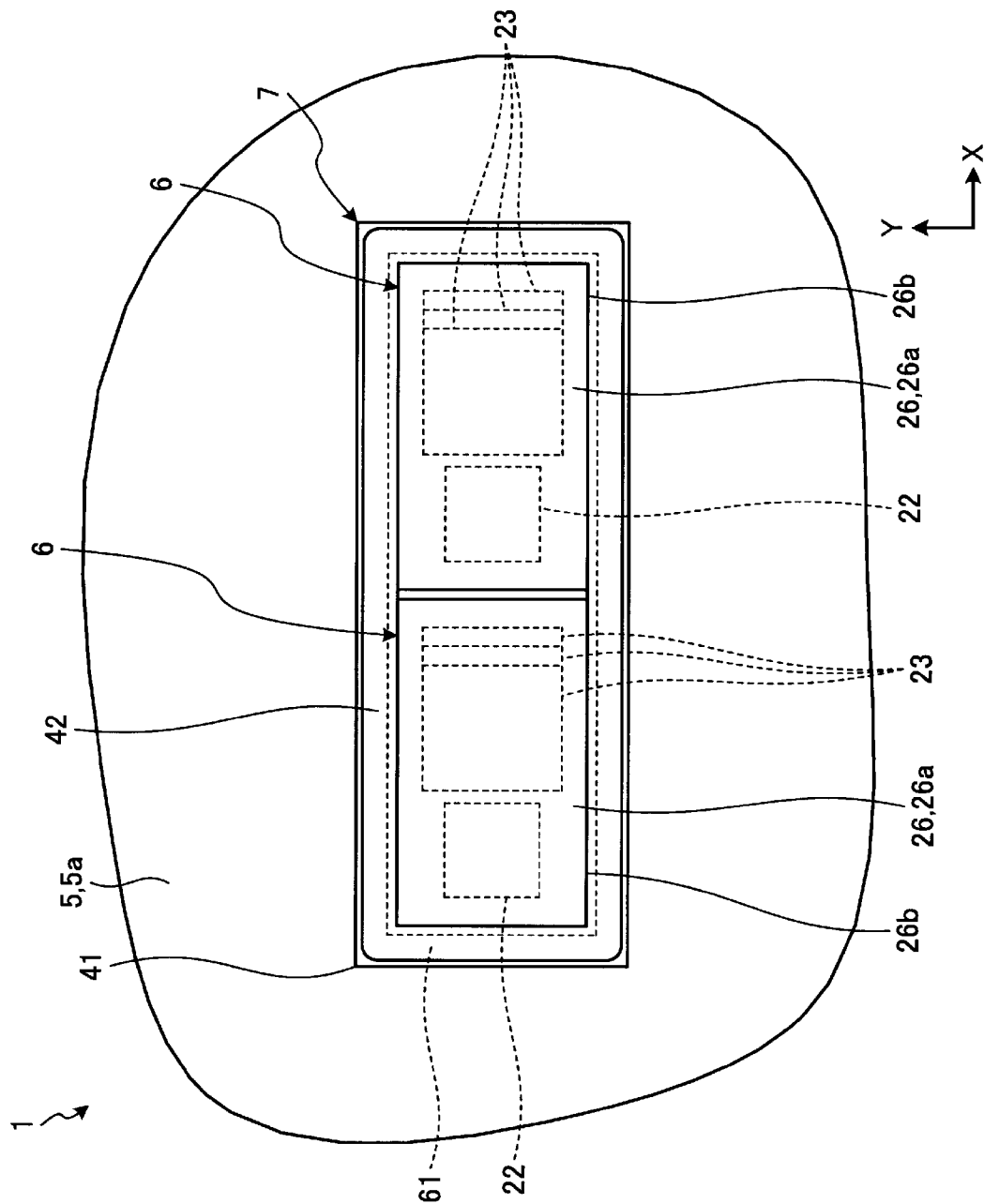
FIG. 7 illustrates a plan view of a part of a semiconductor device according to a modification example of the third embodiment.

FIG. 7 illustrates a plan view of a part of a semiconductor device 1 according to a modification example of the third embodiment. As illustrated in FIG. 7, the metal member 41 includes the frame portion 61. However, the intermediate portion 62 is omitted. Two adjacent semiconductor components 6 are away from each other across a clearance.

In the modification example illustrated in FIG. 7, for example, in the obverse surface 5a of the substrate 5, an area in which to mount semiconductor components 6 is narrower than that of the example illustrated in FIG. 6. Therefore, the intermediate portion 62 is omitted, and the distance between two adjacent semiconductor components 6 is set shorter than that of the example illustrated in FIG. 6.

In the above-described modification example of the third embodiment, in a plan view facing the obverse surface 5a, the frame portion 61 also surrounds a plurality of semiconductor components 6. Therefore, even if a clearance between a plurality of semiconductor components 6 is small, the metal member 41 can be located along the plurality of semiconductor components 6. Accordingly, even if the location of semiconductor components 6 in the substrate 5 has a restriction, the first paste 42 is able to adhere to the metal film 26 and the metal member 41.

Fourth Embodiment

Figure 8:
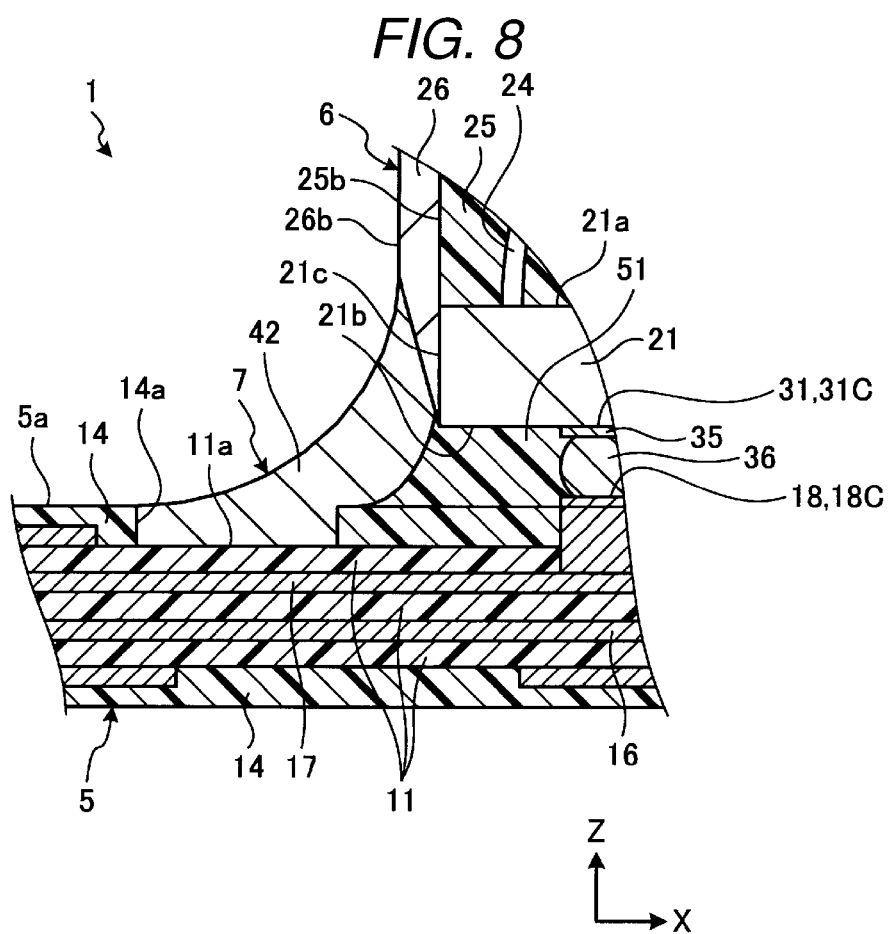
FIG. 8 illustrates a cross-sectional view of a part of a semiconductor device according to a fourth embodiment.

A fourth embodiment is described as follows with reference to FIG. 8. FIG. 8 illustrates a cross-sectional view of a part of a semiconductor device 1 according to the fourth embodiment. As illustrated in FIG. 8, the semiconductor device 1 of the fourth embodiment differs from that of the third embodiment in not including the metal member 41, the second paste 43, and the ground pads 19. Furthermore, as with the first embodiment, the semiconductor device 1 of the fourth embodiment may include no underfill 51 and may include a single semiconductor component 6.

In the fourth embodiment, the base material 11 includes an exposed portion 11a. The exposed portion 11a is a part of the base member 11 exposed on the obverse surface 5a of the substrate 5 via a hole 14a of the solder resist 14. The surface roughness of the exposed portion 11a of the base material 11 is greater than the surface roughness of the solder resist 14.

The first paste 42 adheres to the side surface 26b of the metal film 26 and the exposed portion 11a exposed via the hole 14a. Therefore, the first paste 42 interconnects the metal film 26 and the base material 11 of the substrate 5.

In the semiconductor device 1 according to the above-described fourth embodiment, a hole 14a via which the exposed portion 11a of the base material 11 is exposed is provided in the solder resist 14. The first paste 42 adheres to the exposed portion 11a. Usually, the surface roughness of the base material 11 is greater than the surface roughness of the solder resist 14. This prevents or reduces the first paste 42 from being detached from the substrate 5.

In a plurality of embodiments described above, the ground terminal 31C is closer to the heat conductor 7 than the signal terminal 31A and the power source terminal 31B. However, as a modification example, an additional terminal 31 may be closer to the heat conductor 7 than the signal terminal 31A and the power source terminal 31B. An electrode 18 to which the additional terminal 31 is connected is a non-connect pad which is electrically separated from the conductor layers 12 forming circuits in the substrate 5. This prevents or reduces a short circuit from occurring due to the conductive first paste 42 adhering to the above-described terminal 31. The above-described terminal 31 and the electrode 18 reinforce a connecting portion between the substrate 5 and the semiconductor component 6.

According to at least one of the above-described embodiments, the heat conductor adheres to the metal film of the semiconductor component, interconnects the substrate and the metal film, and is higher in thermal conductivity than the covering resin. This enables heat generated by the electronic component to be transferred to the substrate via the covering resin, the metal film, and the heat conductor. Accordingly, further heat dissipation of the electronic component can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate;
   a semiconductor device module on the substrate, the semiconductor device module including:
      an interposer substrate;
      one or more semiconductor device chips on a first surface of the interposer substrate;
      a covering resin in contact with the first surface of the interposer substrate and the one or more semiconductor device chips and enclosing the one or more semiconductor device chips; and
      a metal film in contact with an upper surface and side surfaces of the covering resin and covering the covering resin;
   a metal plate member provided on the substrate and in thermal contact with the substrate, the metal plate member being not in direct contact with the semiconductor device module and not overlapping with the semiconductor device module when viewed from above the semiconductor device; and
   a heat conductor in thermal contact with the substrate and the metal film, and having a higher thermal conductivity than the covering resin.

2. The semiconductor device according to claim 1, wherein
   the interposer substrate includes one or more terminals on a second surface thereof opposite to the first surface,
   the substrate includes one or more electrodes in contact with the one or more terminals and one or more conductive pads on a surface of the substrate facing the second surface of the interposer substrate, the one or more conductive pads being not in direct contact with the semiconductor device module and not overlapping with the semiconductor device module when viewed from above the semiconductor device, and
   the heat conductor is in thermal contact with the one or more conductive pads.

3. The semiconductor device according to claim 2, wherein the heat conductor is electrically conductive, and the one or more conductive pads are electrically connected to ground.

4. The semiconductor device according to claim 3, wherein
   the one or more electrodes include a signal electrode through which an electrical signal passes, a power source electrode connected to a power source, and a ground electrode connected to the ground, and
   the one or more terminals includes a signal terminal connected to the signal electrode, a power source terminal connected to the power source electrode, and a ground terminal connected to the ground electrode,
   the ground terminal being closer to the heat conductor than the signal terminal and the power source terminal.

5. The semiconductor device according to claim 3, wherein the heat conductor includes a first paste that is in contact with the metal film, has a higher thermal conductivity than the covering resin, and is electrically conductive.

6. The semiconductor device according to claim 5, wherein
   the first paste is in contact with the metal film and the metal plate member.

7. The semiconductor device according to claim 6, wherein the metal plate member surrounds the semiconductor device module when viewed from above the semiconductor device.

8. The semiconductor device according to claim 6, wherein
the one or more semiconductor chips include a plurality of semiconductor chips, and
the metal plate member surrounds the plurality of semiconductor chips when viewed from above the semiconductor device.

9. The semiconductor device according to claim 6, wherein the first paste includes a thermosetting resin.

10. The semiconductor device according to claim 9, wherein
the heat conductor further includes a second paste that includes a thermosetting resin, adheres to the metal plate member and the conductive pad, has a higher thermal conductivity than the covering resin, and is electrically conductive, and
the first paste and the second paste have no fluidity.

11. The semiconductor device according to claim 2, further comprising:
an electrically-insulative underfill between the surface of the substrate and the second surface of the interposer substrate.

12. The semiconductor device according to claim 1, wherein
the substrate includes a base material and a solder resist that covers the base material and is provided between the base material and the semiconductor device module,
a hole that exposes a part of the base material is provided in the solder resist, and
the heat conductor is in contact with a part of the base material exposed through the hole.

13. The semiconductor device according to claim 1, wherein the heat conductor includes a paste that is in contact with the metal film and has a higher thermal conductivity than the covering resin.

14. The semiconductor device according to claim 1, wherein the one or more semiconductor device chips include a memory chip.

15. The semiconductor device according to claim 14, wherein the one or more semiconductor device chips further include a controller chip configured to control the memory chip.

16. The semiconductor device according to claim 15, wherein the heat conductor includes a portion closer to the controller chip than to the memory chip.

17. A semiconductor device comprising:
a first substrate;
a semiconductor chip package on the first substrate, the semiconductor chip package including a second substrate, a semiconductor chip on the second substrate, a resin that covers the semiconductor chip, and a metal film in contact with an upper surface and side surfaces of the resin and covering the resin;
a metal plate member provided on the first substrate and in thermal contact with the first substrate, the metal plate member being not in direct contact with the semiconductor chip package and not overlapping with the semiconductor chip package when viewed from above the semiconductor device; and
a heat conductor in thermal contact with the first substrate and the metal film, and having a higher thermal conductivity than the resin.

18. The semiconductor device according to claim 17, wherein
the second substrate includes a terminal and a conductive pad on a lower surface thereof, and the first substrate includes an electrode in contact with the terminal on the lower surface of the second substrate, and
the heat conductor is in thermal contact with the conductive pad.

19. The semiconductor device according to claim 18, wherein the conductive pad is electrically connected to ground.

20. The semiconductor device according to claim 18, wherein the terminal is one of a signal terminal, a power source terminal, and a ground terminal, and the electrode is one of a signal electrode, a power source electrode, and a ground electrode.

* * * * *